United States Patent
Ding et al.

(10) Patent No.: US 9,412,736 B2
(45) Date of Patent: Aug. 9, 2016

(54) EMBEDDING SEMICONDUCTOR DEVICES IN SILICON-ON-INSULATOR WAFERS CONNECTED USING THROUGH SILICON VIAS

(71) Applicant: GLOBALFOUNDRIES INC., Grand Cayman (KY)

(72) Inventors: Yan Ding, Essex Junction, VT (US); Vibhor Jain, Essex Junction, VT (US); Thomas Kessler, Burlington, VT (US); Yves T. Ngu, Essex Junction, VT (US); Robert M. Rassel, Colchester, VT (US); Sebastian T. Ventrone, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/296,812

(22) Filed: Jun. 5, 2014

(65) Prior Publication Data

US 2015/0357325 A1     Dec. 10, 2015

(51) Int. Cl.
| | |
|---|---|
| *H01L 21/30* | (2006.01) |
| *H01L 27/06* | (2006.01) |
| *H01L 23/48* | (2006.01) |
| *H01L 21/768* | (2006.01) |
| *H01L 23/367* | (2006.01) |

(Continued)

(52) U.S. Cl.
CPC ...... *H01L 27/0694* (2013.01); *H01L 21/76898* (2013.01); *H01L 21/84* (2013.01); *H01L 23/3677* (2013.01); *H01L 23/481* (2013.01); *H01L 27/1203* (2013.01); *H01L 2924/0002* (2013.01)

(58) Field of Classification Search
None
See application file for complete search history.

(56) References Cited

U.S. PATENT DOCUMENTS

| | | |
|---|---|---|
| 6,355,501 B1 | 3/2002 | Fung et al. |
| 6,686,233 B2 | 2/2004 | Suderbarg et al. |

(Continued)

FOREIGN PATENT DOCUMENTS

EP     1851797 B1     3/2012

OTHER PUBLICATIONS

Giry, et al., "A Monolithic Watt-level SOI LDMOS Linear Power Amplifier with Through Silicon Via for 4G Cellular Applications", 2013 IEEE Topical Conference on Power Amplifiers for Wireless and Radio Applications (PAWR), pp. 19-21 (2013).

(Continued)

*Primary Examiner* — Benjamin Sandvik
*Assistant Examiner* — Herve Assouman
(74) *Attorney, Agent, or Firm* — Anthony J. Canale (57) ABSTRACT

In an approach to fabricating a silicon on insulator wafer, one or more semiconductor device elements are implanted and one or more shallow trench isolations are formed on a top surface of a first semiconductor wafer. A first dielectric material layer is deposited over the top surface of the first semiconductor wafer, filling the shallow trench isolations. A dielectric material layer on a bottom surface of a second semiconductor wafer is bonded to a dielectric material layer on the top of the first semiconductor wafer and one or more semiconductor devices are formed on a top surface of the second semiconductor wafer. Then, one or more through silicon vias are created connecting the one or more semiconductor devices on the top surface of the second semiconductor wafer and the one or more semiconductor device elements on the top surface of the first semiconductor wafer.

19 Claims, 8 Drawing Sheets

(51) Int. Cl.
*H01L 21/84* (2006.01)
*H01L 27/12* (2006.01)

(56) References Cited

U.S. PATENT DOCUMENTS

| | | | |
|---|---|---|---|
| 6,861,341 | B2 | 3/2005 | Chen et al. |
| 7,064,041 | B2 | 6/2006 | Tanaka |
| 7,518,169 | B2 | 4/2009 | Taddiken |
| 7,531,403 | B2 | 5/2009 | Icel et al. |
| 7,732,864 | B2 | 6/2010 | Kawahara et al. |
| 7,781,843 | B1 | 8/2010 | Weaver et al. |
| 7,855,101 | B2 | 12/2010 | Furman et al. |
| 7,989,312 | B2 | 8/2011 | Bernstein et al. |
| 8,350,331 | B2 | 1/2013 | Tsujiuchi et al. |
| 2003/0129829 | A1* | 7/2003 | Greenlaw ............. H01L 21/743 438/637 |
| 2004/0262635 | A1* | 12/2004 | Lee ....................... B82Y 10/00 257/199 |
| 2005/0286287 | A1* | 12/2005 | Park et al. ....................... 365/63 |
| 2007/0267723 | A1* | 11/2007 | Bernstein ............. H01L 23/481 257/621 |
| 2009/0042365 | A1* | 2/2009 | McDonald ..................... 438/459 |
| 2009/0065941 | A1* | 3/2009 | La Tulipe et al. ............. 257/761 |
| 2009/0224364 | A1* | 9/2009 | Oh ....................... H01L 21/2007 257/532 |
| 2009/0325343 | A1* | 12/2009 | Lee ..................... H01L 21/2007 438/107 |
| 2010/0176506 | A1* | 7/2010 | Hsu ........................ H01L 23/481 257/698 |
| 2011/0089517 | A1* | 4/2011 | Venezia ............. H01L 27/14603 257/447 |
| 2011/0143506 | A1* | 6/2011 | Lee ........................ H01L 23/481 438/238 |
| 2011/0248396 | A1* | 10/2011 | Liu ..................... H01L 25/0657 257/686 |
| 2012/0228713 | A1 | 9/2012 | Chen et al. |
| 2012/0267788 | A1 | 10/2012 | Hong et al. |
| 2014/0239457 | A1* | 8/2014 | Daubenspeck et al. ....... 257/621 |

OTHER PUBLICATIONS

Motorola, Inc, et al., "A Method to Fabricate Multiple Semiconductor Functions on One Chip", An IP.com Prior Art Database Technical Disclosure, Jan. 1, 2000, IPCOM000009653D.

Sasaki, et al., "A Three-Dimensional High-Voltage CMOS Utilizing a Laser-Recrystallized SQ1 Layer", IEEE Transactions on Electron Devices, 34(11), p. 2361 (1987).

* cited by examiner

EMBEDDING SEMICONDUCTOR DEVICES IN SILICON-ON-INSULATOR WAFERS CONNECTED USING THROUGH SILICON VIAS

FIELD OF THE INVENTION

The present invention relates generally to the field of semiconductor devices, and more specifically, to silicon on insulator technology.

BACKGROUND

In the manufacture of integrated circuits, there is a continuing desire to fit more semiconductor devices and circuits on semiconductor wafers. The drive for miniaturization and increasing circuit density is driven by a number of factors, including device speed, as denser circuits are closer together for fast communication, wafer utilization (more circuits per wafer) and potential semiconductor chip cost reduction as the number of semiconductor chips per wafer increase. However, as is usually the case, tradeoffs occur with increasing miniaturization and increased circuit density. As the semiconductor manufacturing processes are adjusted to enhance the performance of semiconductor devices, the thermal cycles required to create the semiconductor devices may adversely affect the performance of other nearby semiconductor devices or circuits. Additionally, as semiconductor devices are packed closer together, the heat generated by one semiconductor device may adversely affect the performance of another nearby semiconductor device.

One manufacturing method for creating wafers and semiconductor chips with improved performance, such as lower parasitic capacitance and reduced resistance to latch up, in addition to providing miniaturization capability, is the use of silicon on insulator (SOI) technology for wafer and subsequent semiconductor chip formation. SOI wafers provide layers of silicon separated by an insulation layer such as silicon dioxide. Fabricated semiconductor devices may be in the layer of silicon above an electrical insulator, improving performance capabilities. SOI wafers may be created by either an oxygen implantation using a high temperature anneal process or by bonding two wafers together with an oxide layer or dielectric material layer sandwiched between the wafers. The wafers, at least one of which is covered by an insulating or oxide layer, may be bonded by adhesive, or fusion bonded if both surfaces are covered with an oxide layer. SOI wafers provide improved performance and opportunities to utilize additional available wafer space created with an SOI structure. The processes involved in the manufacture of SOI wafers are consistent with semiconductor manufacturing tools and thus require little investment to implement.

SUMMARY

Embodiments of the present invention provide methods and structures for forming silicon on insulator wafers with embedded devices using through silicon vias. A method includes implanting one or more semiconductor device elements on a top surface of a first wafer. The method includes forming one or more shallow trench isolations on the top surface of the first wafer and depositing a dielectric material layer over the top surface of the first wafer. The method includes forming at least one additional semiconductor device element on the top surface of the first wafer to form one or more semiconductor devices on the top surface of the first wafer. The method includes bonding the dielectric material layer on the top surface of the first wafer to a dielectric material layer on a bottom of the second wafer and subsequently forming one or more semiconductor devices on a top surface of the second semiconductor wafer. Then, the method includes connecting the one or more semiconductor devices on the top surface of the second semiconductor wafer and the one or more semiconductor devices on the top surface of the first semiconductor wafer by creating one or more through silicon vias.

Another method of fabricating silicon on insulator wafers with embedded devices comprises implanting one or more semiconductor device elements on a top surface of a first semiconductor wafer. The method includes forming one or more shallow trench isolations on the top surface of the first semiconductor wafer which includes depositing a dielectric material layer on the top surface of the first semiconductor wafer to form semiconductor devices on the top surface of the first semiconductor wafer. The method includes implanting one or more semiconductor device regions on a top surface of an at least one additional semiconductor wafer. Subsequently, one or more shallow trench isolations are formed on the top surface of the at least one additional semiconductor wafer which includes depositing a dielectric material layer on the top surface of the at least one additional semiconductor wafer to form semiconductor devices on the top surface of the at least one additional semiconductor wafer. The method then includes bonding a bottom surface of the first semiconductor wafer to the dielectric material layer on the top surface of the at least one additional semiconductor wafer and bonding the dielectric material layer on a bottom surface of a second semiconductor wafer to the dielectric material layer on the top surface of the first semiconductor wafer. The method then includes forming one or more semiconductor devices on the top surface of the second semiconductor wafer. The one or more semiconductor devices are one or more of active semiconductor devices, one or more passive semiconductor devices or a combination of one or more active semiconductor devices and passive semiconductor devices. Next, the method includes creating through silicon vias connecting each of the following semiconductor devices: the one or more semiconductor devices on the top surface of the second semiconductor wafer, the one or more semiconductor devices on the top surface of the first semiconductor wafer and the one or more semiconductor devices on the top surface of the at least one additional semiconductor wafer.

A structure for silicon on insulator wafer with embedded devices connected by through silicon vias in accordance with the present invention includes a first semiconductor wafer with one or more semiconductor devices on a top surface, one or more shallow trench isolations on the top surface covered with a dielectric layer and a semiconductor device element formed on the dielectric material layer, the dielectric material layer covering the top surface of the first wafer. The structure includes a second semiconductor wafer with one or more semiconductor devices on a top surface of the second semiconductor wafer and the second semiconductor wafer bonded by a bottom surface to the top surface of the first semiconductor wafer. The structure includes a dielectric material layer between the top surface of the first semiconductor wafer and the bottom surface of the second semiconductor wafer and one or more through silicon vias connecting the one or more semiconductor devices on the top surface of the first semiconductor wafer to the one or more semiconductor devices on the top surface of the second semiconductor wafer.

DETAILED DESCRIPTION

Embodiments of the present invention recognize that high current and high power applications may use semiconductor devices such as high voltage metal oxide transistors (HV MOS transistors). HV MOS transistors utilize features such as a long drain region or drift area to increase voltage depletion and isolation trenches to create a longer circuit path to help dissipate high voltages thus, consuming significant space to achieve a desired high breakdown voltage. Additionally, HV MOS transistors for some applications may be used in parallel to achieve high current requirements further consuming wafer and semiconductor chip space. Embodiments of the present invention recognize that semiconductor devices such as HV MOS transistors utilizing significant wafer space or generating significant heat create opportunities to increase circuit density and potentially improve performance by moving these semiconductor devices to under utilized or unused wafer areas in a silicon on insulator (SOI) wafer structure thus, potentially improving wafer circuit density and heat sensitive semiconductor device performance by isolating semiconductor devices such as HV MOS transistor generating significant heat and using large areas of wafers.

Embodiments of the present invention propose a method and structure for creating a SOI wafer with semiconductor devices embedded in the SOI wafer adjacent to the buried oxide (BOX). In an embodiment of the present invention, a gate or similar semiconductor device element of the embedded semiconductor device may be included or embedded in the BOX layer of the SOI wafer. Embodiments of the present invention provide the effective use of unused silicon and the opportunity for denser device circuit creation on a wafer or a resulting chip in addition to providing an opportunity to move semiconductor devices generating significant heat away from heat sensitive devices. Furthermore, embodiments of the present invention provide the capability to create semiconductor devices on the top surface of the SOI wafer and the bottom surface of the handling wafer, in addition to embedded semiconductor devices in the handling wafer either adjacent to the BOX or partially embedded in the BOX utilizing through silicon vias (TSVs) to create connections as required between top surface, bottom surface and embedded semiconductor devices. In addition, embodiments of the present invention provide a method for heat dissipation of embedded semiconductor devices using TSVs, backside thinned wafer and the use of conventional heat sinks. In one embodiment, a stack of multiple handling wafers with top surface passive devices may be bonded together with an insulating layer or oxide layer between the stacked handling wafers. The handling wafers may be bonded to another wafer with active semiconductor devices on the top surface to form a stacked SOI wafer structure with multiple layers of embedded semiconductor devices. Electrical connections may be created between contacts on the embedded passive semiconductor devices in the various wafers in the stacked wafers and contacts on the semiconductor devices on the top surface of the SOI wafer by TSVs.

Detailed embodiments of the claimed structures and methods are disclosed herein, however, it is to be understood that the disclosed embodiments are merely illustrative of the claimed structures and methods that may be embodied in various forms. Descriptions of well-known components and processing techniques may be omitted so as to not unnecessarily obscure the embodiments herein. In addition, specific structural and functional details disclosed herein are not to be interpreted as limiting, but merely as a representative basis for teaching one skilled in the art to variously employ the methods and structures of the present disclosure.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom" and derivatives thereof shall relate to the disclosed structures and methods, as oriented in the Figures. The terms "on", "over", "overlying", "atop", "positioned on" or "positioned atop" mean that a first element, such as a first structure, is present on a second element, such as a second structure, wherein intervening elements, such as an interface structure may be present between the first element and the second element. The terms "direct contact", "directly on" or "directly over" mean that a first element, such as a first structure and a second element, such as a second structure, are connected without any intermediary conducting, insulating or semiconductor layers at the interface of the two elements. The terms "connected" or "coupled" mean that one element is directly connected or coupled to another element or intervening elements may be present. The terms "directly connected" or "directly coupled" mean that one element is connected or coupled to another element without any intermediary elements present.

In accordance with semiconductor manufacturing processes, embodiments of the present invention are for the formation of semiconductor circuits utilized in integrated circuits or semiconductor chips formed or "diced" from semiconductor wafers, for example, silicon wafers. Multiple integrated circuits and semiconductor chips may be fabricated simultaneously on wafers. The processes used in the embodiments of the present invention require the joining of wafers at various stages of fabrication and that the various wafers are able to be modified (elements added or removed) before or after joining and during fabrication, and that the reference numbers used to initially identify materials, layers or elements will be retained in subsequent drawings. Because wafers at the various processing steps depicted contain the same elements (e.g. oxides, polysilicon, silicon layers, silicon regions (implanted or doped regions), gates, drains and similar elements), the reference numbers for these elements have been left the same in the various stages of wafer processing. However, if the reference number of an element in a wafer is initially explicitly stated, it will be continued for the processing of the wafer to avoid confusion and any changes to the element will be clearly stated.

Figure 1:
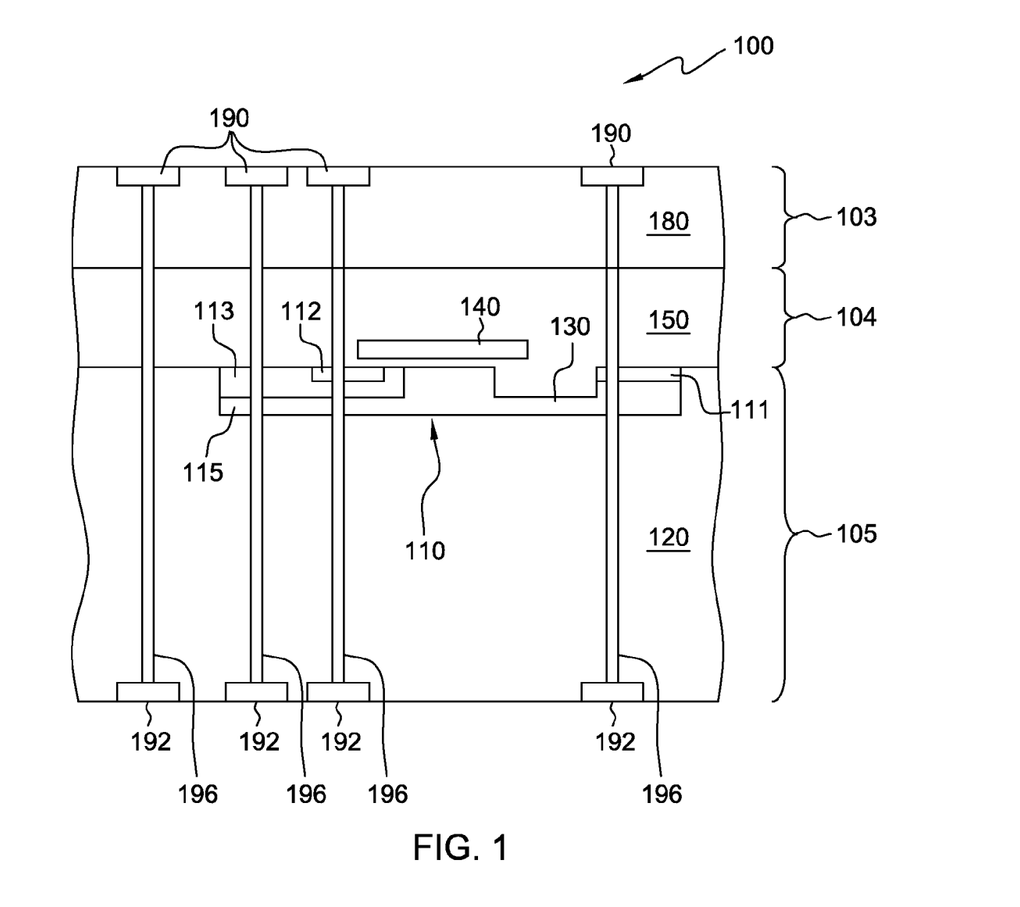
FIG. 1 illustrates a cross-sectional view of a silicon on insulator wafer (SOI) with embedded semiconductor devices connected by through silicon vias (TSVs) in accordance with an embodiment of the present invention.

FIG. 1 illustrates a cross-sectional view of a SOI wafer with embedded semiconductor devices connected by TSVs in accordance with an embodiment of the present invention. FIG. 1 is a cross-section of SOI wafer 100 with an embedded semiconductor device, semiconductor device 110, top surface semiconductor devices, semiconductor devices 190 and bottom surface semiconductor devices, semiconductor devices 192 connected by TSVs 196. SOI wafer 100 may be created by bonding an external oxide layer of a first semiconductor wafer (e.g. handling wafer 105) to an external oxide layer of a second semiconductor wafer (e.g. wafer 103) using known wafer bonding techniques such as adhesive bonding. The combined oxide layers form a buried oxide layer or BOX 104. BOX 104 is made of oxide 150 which is a dielectric material. In the exemplary embodiment, oxide 150 is silicon dioxide. In other embodiments, oxide 150 may be another dielectric material such as silicon nitride, another oxide material such as an oxinitride or a combination of dielectric materials (i.e. a stack of dielectric materials).

FIG. 1 includes a first semiconductor wafer (e.g. handling wafer 105) composed of semiconductor material 120 which may be silicon doped to create a p-type wafer substrate. Handling wafer 105 may be a single crystal silicon wafer, but, in another embodiment, handling wafer 105 may be a polycrystalline silicon wafer. In other embodiments, handling wafer 105 may be doped with another type of doping element (n-type element) and may be composed of another semiconductor material (sapphire or other semiconductor material). Semiconductor device 110 is a semiconductor device. Semiconductor device 110, embedded in SOI wafer 100, is depicted as a high voltage metal oxide transistor (HV MOS). Semiconductor device 110 includes semiconductor device elements such as drain 111, source 112, body 113 and well 115 which are semiconductor device regions implanted in handling wafer 105 along with the formation of a shallow trench isolation (STI) 130 in handling wafer 105. STI 130 is filled with a dielectric material, oxide 130, which is silicon dioxide, however in another embodiment, oxide 130 may be another dielectric material such as high-k dielectric materials, silicon oxinitride, Al2O3 or similar oxide or a combination of these in place of silicon dioxide. Gate 140 above the top surface of handling wafer 105 is in buried oxide (BOX) 104, which is formed on the top surface of handling wafer 105. Semiconductor device 110 is adjacent to BOX 104 and may have semiconductor device elements such as gates embedded in BOX 104 as illustrated in FIG. 1. In another embodiment of the present invention, other semiconductor device elements, for example, a raised drain, a source, a well, a fin, a channel or a body may be embedded in BOX 104.

Figure 3:
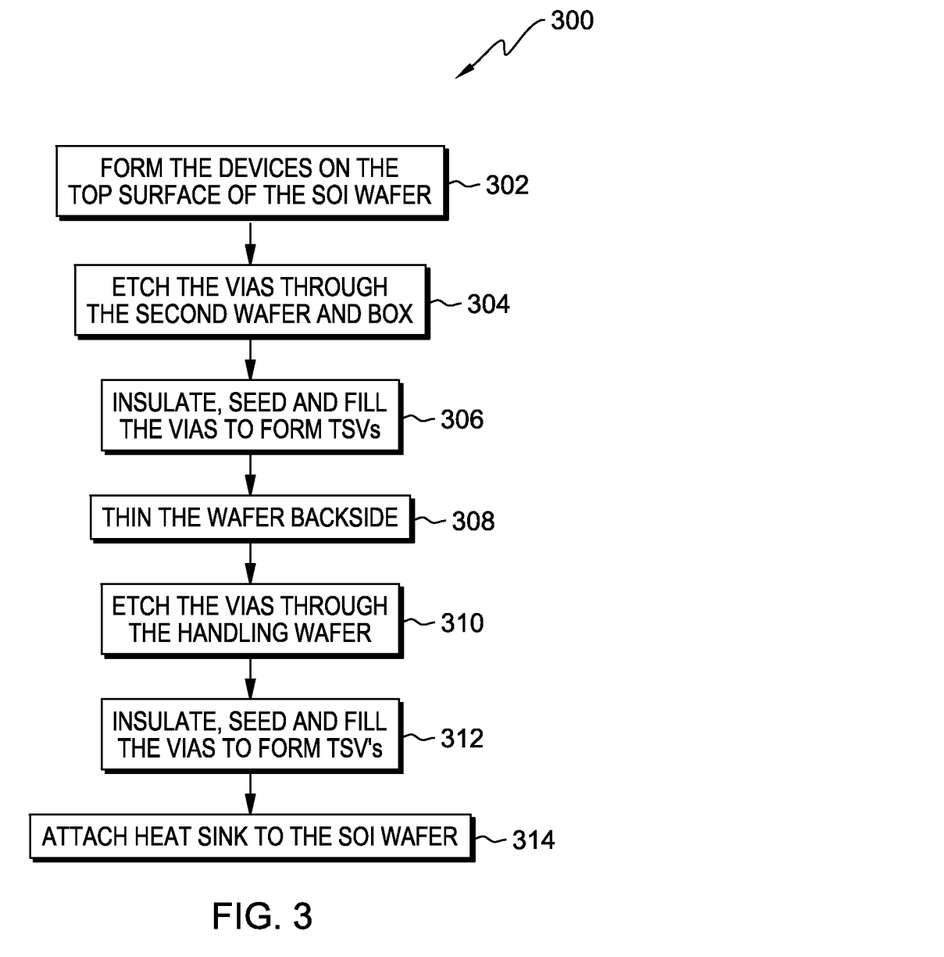
FIG. 3 is an exemplary process flow chart for creating the SOI semiconductor chip with a heat sink attached illustrated in FIG. 2, according to an embodiment of the present invention.

Semiconductor device 110 as depicted in the exemplary embodiment is a HV MOS transistor, however, in a different embodiment, the layout, cross-section and doping elements may vary in the HV MOS semiconductor device. While depicted as a HV MOS transistor, in other embodiments, semiconductor device 110 may be another type of active semiconductor device such as a laterally diffused metal oxide semiconductor (LDMOS) semiconductor device, diffusion transistor including bipolar junction transistor, bipolar semiconductor device, power semiconductor device or other active semiconductor devices. Semiconductor device 110 may also be an array of active semiconductor devices such as an array of HV MOS transistors. Semiconductor device 110 may also be a passive semiconductor device such as waveguide, capacitor, junction capacitor, resistor implant or a group of passive semiconductor devices. In an embodiment, semiconductor device 110 may be in a stack of passive semiconductor devices on multiple handling wafers, as depicted in FIG. 3. In another embodiment, semiconductor device 110 may include multiple semiconductor devices 110 and may be a combination of semiconductor devices, e.g. a mix of active semiconductor devices and passive semiconductor devices or a mix of different types of active semiconductor devices, HV MOS semiconductor devices and bipolar semiconductor devices or different types of passive semiconductor devices (e.g. well resistors and waveguides).

Semiconductor devices 192 shown on the bottom surface of handling wafer 105 may be low voltage semiconductor devices such as complementary metal-oxide semiconductor (CMOS) semiconductor devices however, in other embodiments, semiconductor devices 192 may be other active semiconductor devices (bipolar semiconductor devices, for example), passive semiconductor devices or a combination of active and passive semiconductor devices. Not shown on the bottom of semiconductor devices 192 are the back end of the line (BEOL) interconnection layers which may be present and can include electrical connections such as wiring, metal via connections using tungsten, for example, dielectric layers which may be low dielectric constant materials (low k materials), external bonding pads and BEOL semiconductor devices such as inductors.

A second wafer, wafer 103 is composed of semiconductor material 180 which can be silicon doped to create a p-type wafer. Wafer 103 may be a single crystal silicon wafer with a dielectric material, oxide 150, formed on the bottom surface. In another embodiment, oxide 150 can be a low dielectric material or another oxide material. Semiconductor devices 190 may be formed on the top surface of second wafer 103. Similar to semiconductor devices 192, semiconductor devices 190 which may be low voltage CMOS semiconductor devices, other active semiconductor devices (bipolar semiconductor devices, for example), passive semiconductor devices or a combination of active and passive semiconductor devices in other embodiments. Not shown above semiconductor devices 190 are the back end of the line (BEOL) interconnection layers which may be present and can include electrical connections such as wiring, metal via connections, dielectric layers and BEOL semiconductor devices.

Through silicon vias (TSVs) 196 electrically connect contacts on semiconductor devices 190 on the top surface of wafer 103 with contacts on semiconductor devices 192 on the bottom of handling wafer 105 and to contacts on semiconductor device 110 embedded in SOI wafer 100.

While semiconductor devices 190 and semiconductor devices 192 may be low voltage semiconductor devices such as low voltage CMOS semiconductor devices and semiconductor device 110 is depicted as a HV MOS transistor, semiconductor devices 190, semiconductor devices 192 and semiconductor device 110 may be any combination of semiconductor devices (active or passive) required for an application or semiconductor chip design and compatible with the semiconductor processes used for manufacture.

FIGS. 1A-1E are cross-sectional views illustrating the processes used to form the SOI wafer structure shown in FIG. 1. The method of manufacturing passive semiconductor devices, HV MOS devices, low voltage CMOS devices and the other active semiconductor devices is well known to one skilled in the art of semiconductor manufacture and some of the conventional manufacturing steps and associated materials may only be mentioned briefly or omitted without details.

Figure 1A:
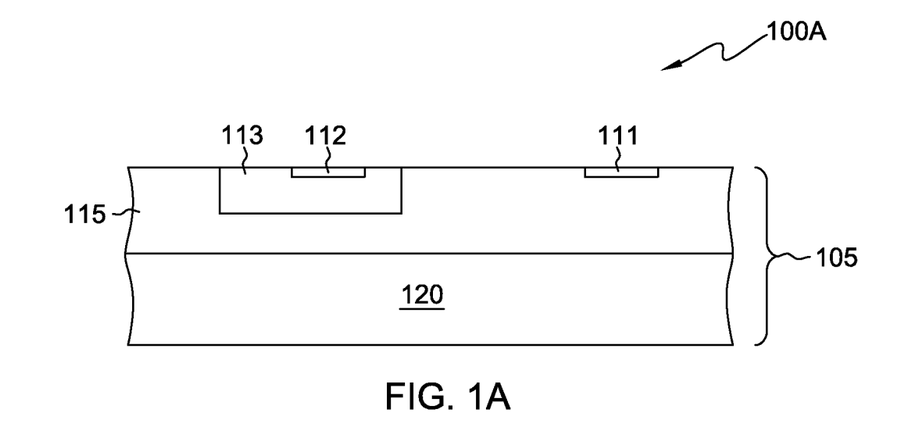
FIG. 1A illustrates a cross-sectional view of a handling wafer, according to an embodiment of the present invention.

FIG. 1A is a cross-section depicting wafer 100A according to an embodiment of the present invention. Wafer 100A is a handling wafer (e.g. handling wafer 105) which may be a single crystal silicon wafer. In an exemplary embodiment, handling wafer 105 is composed of semiconductor material 120 doped with boron by ion implantation to be a p type semiconductor substrate. In other embodiments, handling wafer 105 may use other semiconductor substrate materials for semiconductor material 120. For example, semiconductor material 120 may be germanium, sapphire or compound semiconductors like silicon carbide, polycrystalline silicon or gallium arsenide. Similarly, in other embodiments, other doping materials, for example, boron trifluoride (BF3) may be used. In another embodiment, handling wafer 105 may be an n-type semiconductor doped with an element such as phosphorous. In an embodiment, handling wafer 105 may be an intrinsic silicon wafer (without doping elements implanted). The type of wafer doping (p-type or n-type) used on handling wafer 105 may be determined by the designer or manufacture based on the semiconductor chip application.

Handling wafer 105 is implanted with doping elements to form semiconductor device regions creating device elements such as drain 111, source 112, body 113, and well 115. The semiconductor device regions created by implanting n type and p type elements on the top surface of handling wafer 105 include terminals such as sources and drains, electrodes such as gates and bodies, in addition to n and p wells. In another embodiment, a handling wafer may be implanted with another type of semiconductor device region.

Figure 1B:
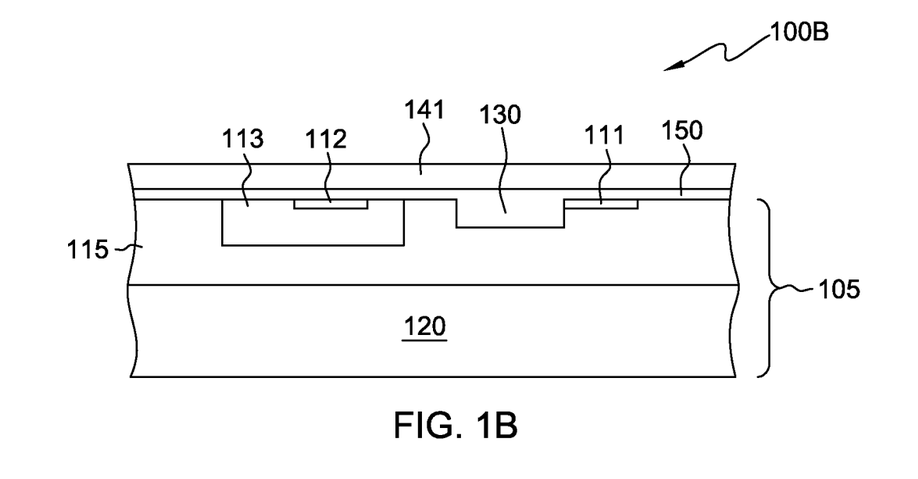
FIG. 1B illustrates a cross-sectional view of the handling wafer of FIG. 1A after STI formation, according to an embodiment of the present invention.

FIG. 1B illustrates a cross-sectional view of the handling wafer of FIG. 1A after STI formation, according to an embodiment of the present invention. In FIG. 1B, further processing continues on the wafer depicted in FIG. 1A. On wafer 100B, the formation of STI 130 may be completed using known manufacturing processes such as hard mask apply (SiN for example), photolithography, STI etch and oxide deposit. STI 130 is filled with oxide 150 which may be an oxide material such as silicon dioxide formed by industry standard processes such as deposition (chemical vapor deposition, physical vapor deposition, atomic layer deposit, sputtering or similar process). Oxide 150 is deposited to cover a top surface of handling wafer 105 and to fill STI 130. In other embodiments, handling wafer 105 can be covered and STI 130 can be filled with another dielectric material for oxide 150 such as high-k dielectric materials, silicon oxinitride, Al2O3, or similar oxide or a combination of these in place of silicon dioxide. In FIG. 1B, gate material layer 141 is deposited by standard deposition processes and is composed of polysilicon. In another embodiment, the gate material used for gate material layer 141 could also be another gate material such as amorphous silicon or similar gate material compatible with SOI processes.

Figure 1C:
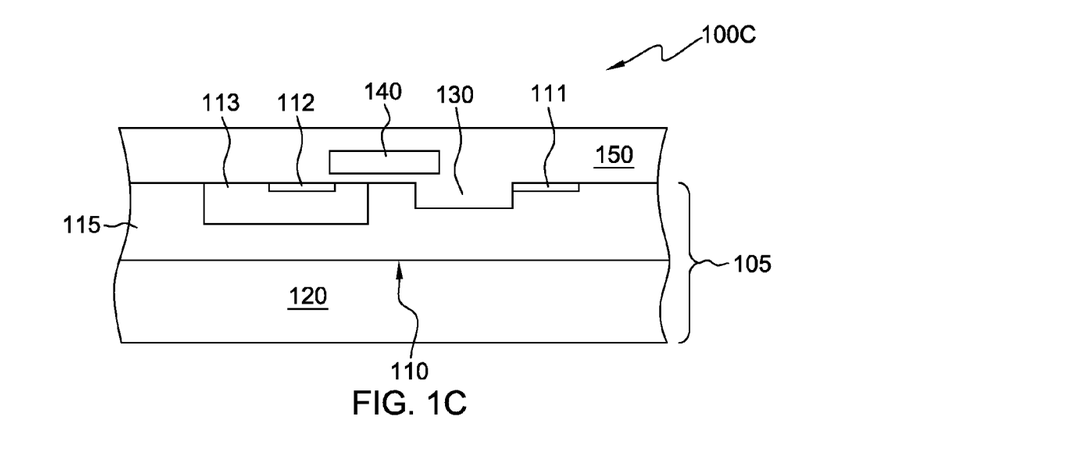
FIG. 1C illustrates a cross-sectional view of the handling wafer of FIG. 1B after gate formation and oxide deposit, according to an embodiment of the present invention.

FIG. 1C illustrates a cross-sectional view of the handling wafer of FIG. 1B after gate formation and oxide deposit according to an embodiment of the present invention. Wafer 100C includes handling wafer 105, gate 140 and oxide 150. The gate 140, composed of polysilicon is etched from gate material layer 141 deposited as shown in FIG. 1B and formed on handling wafer 105 using standard manufacturing processes, for example, photolithography patterning (maskless lithography, electron beam or ion beam patterning) and conventional etch processes. After gate 140 is formed, a layer of oxide 150 may be deposited on gate 140 and the top surface of handling wafer 105. Wafer 100C may be planarized using a chemical mechanical polish (CMP), for example. In the exemplary embodiment illustrated in FIG. 1C, handling wafer 105 includes semiconductor device 110 which is a HV MOS device or a HV MOS transistor composed of drain 111, source 112, body 113, well 115, STI 130 and gate 140. Semiconductor device 110 on handling wafer 105 is covered with oxide 150.

Figure 1D:
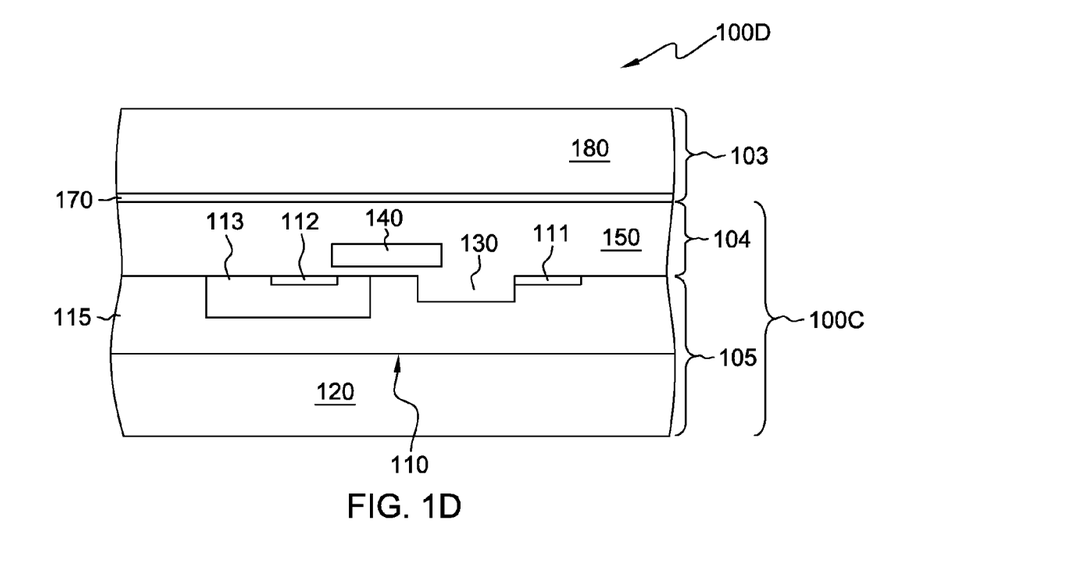
FIG. 1D illustrates a cross-sectional view of a SOI wafer formed after bonding the handling wafer of FIG. 1C to another wafer, according to an embodiment of the present invention.

FIG. 1D illustrates a cross-sectional view of a SOI wafer formed after bonding the handling wafer of FIG. 1C to another wafer, according to an embodiment of the present invention. Wafer 100C depicted in FIG. 1C is bonded to an oxide 170 on a bottom surface of wafer 103. Wafer 103 is composed of semiconductor material 180 which may be doped to create a p-type silicon wafer substrate. Wafer 103 may be a doped, silicon single crystal with an oxide, oxide 170 created on one surface of wafer 103. In other embodiments, wafer 103 may be a polycrystalline silicon wafer. In other embodiments, wafer 103 may be made of any semiconductor or wafer material used in SOI structures including sapphire, germanium, or compound semiconductors like silicon carbide or gallium arsenide. Wafer 103 is formed by processes known to one skilled in the art and may be implanted to form p-type wafer substrate. In another embodiment, wafer 103 may be implanted with other elements, p-type doping elements or n-type doping elements such as phosphorous as required for the semiconductor device application. In one embodiment, wafer 103 may be an intrinsic wafer (no doping elements).

In the exemplary embodiment, oxide 170 on wafer 103 is silicon dioxide however, in other embodiments oxide 170 may be, for example, a high-k dielectric material, silicon oxinitride, Al2O3, or similar material. Wafer 103 is bonded to handling wafer 105. Oxide 150 on handling wafer 105 is bonded to oxide layer 170 on wafer 103 using standard wafer bonding techniques for example, fusion bonding silicon oxide to silicon oxide or by an intermediate layer bonding (e.g. adhesives). Bonding of oxide 150 on handling wafer 105 to the oxide layer 170 of the second wafer, wafer 103 forms a SOI wafer; wafer 100D as shown in FIG. 1D. In subsequent figures, oxide 150 on handling wafer 105 and oxide 170 on wafer 103 are combined and identified as oxide 150 and may be referred to as buried oxide (BOX) 104 in subsequent references. In other embodiments, oxide 150 and oxide 170 can be different oxides or other dielectric materials capable of providing the required electrical properties for the wafer formed in FIG. 1D and capable of being bonded together.

Figure 1E:
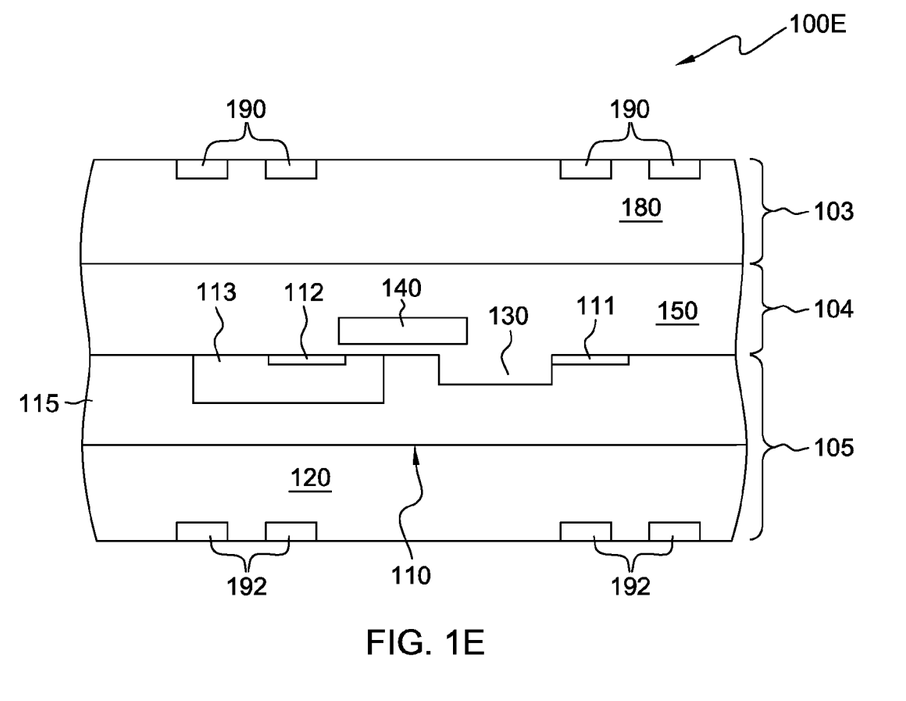
FIG. 1E illustrates a cross-sectional view of the SOI wafer of FIG. 1D after the formation of top surface semiconductor devices and bottom surface semiconductor devices, according to one embodiment of the present invention.

FIG. 1E illustrates a cross-sectional view of the SOI wafer of FIG. 1D after the formation of top and bottom surface semiconductor devices, according to one embodiment of the present invention. Wafer 100E depicts the SOI wafer after the formation of top surface semiconductor devices, semiconductor devices 190 and the formation of bottom surface semiconductor devices, semiconductor devices 192, using known manufacturing processes for implanting various doping elements and associated wafer annealing processes for semiconductor device manufacturing as required for electrical circuit or semiconductor device performance requirements. Prior to the formation of semiconductor devices 190 and semiconductor devices 192, wafer 103 of the SOI wafer structure may be thinned using conventional methods. In the exemplary embodiment, semiconductor devices 190 and semiconductor devices 192 are low voltage CMOS devices however, in other embodiments, semiconductor devices 190 and semiconductor devices 192 may be other active semiconductor devices such as bipolar semiconductor devices or a combination of active semiconductor devices and passive semiconductor devices such as resistors, capacitors, inductors.

After the formation of semiconductor devices 190 and semiconductor devices 192, TSVs 196 are created to form the wafer structure (e.g. wafer 100) illustrated in FIG. 1. In an exemplary embodiment of wafer 100 in FIG. 1, contacts on semiconductor devices 190, semiconductor devices 192 and semiconductor device 110 are electrically connected to lines or terminals for the semiconductor devices by TSVs 196.

Figure 2:
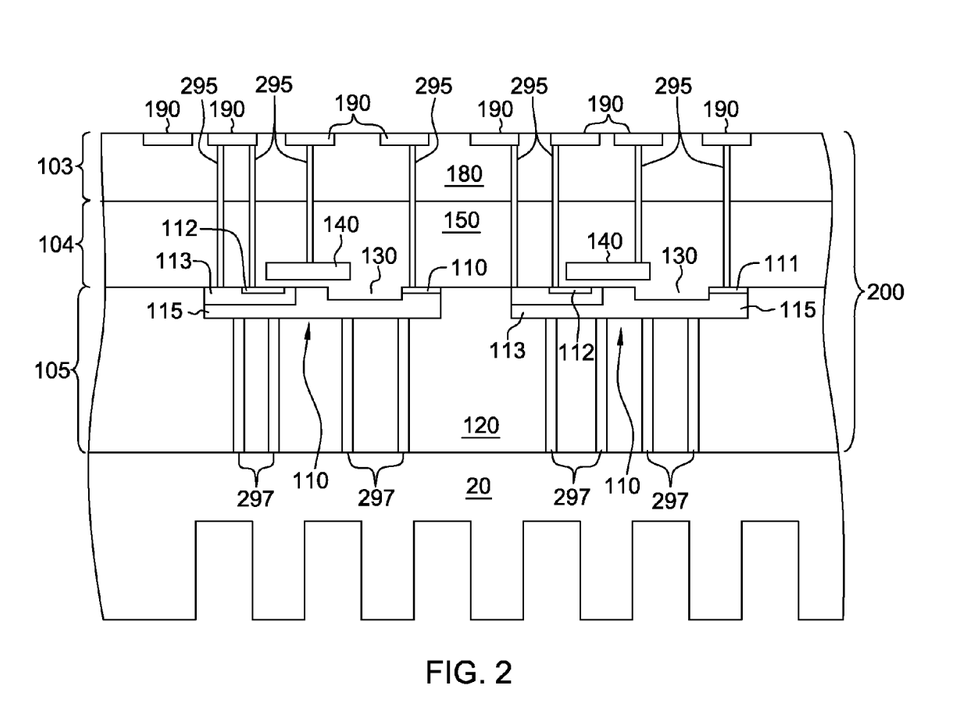
FIG. 2 illustrates a cross-sectional view of a semiconductor chip created from a SOI wafer with a heat sink attached, according to an embodiment of the present invention.

TSV formation may be accomplished by a via formation or a via etch using a selective, deep silicon reactive ion etch, for example. A deep silicon reactive ion etch chamber may be used to etch vias for TSV formation. Etching the vias may be a one, a two or a multi-step process depending on the depth required for the TSVs and the materials used in the SOI wafer structure. In the exemplary embodiment illustrating through wafer TSVs such as TSVs 196 shown in FIG. 1, a three step process may be used with a selective silicon etch of handling wafer 105 followed by a selective etch of the oxide layer (oxide 150 of BOX 104) and another selective silicon etch of wafer 103 to create the via for TSVs 196. In another embodiment, a selective single step etch may be used for the via formation. In some embodiments, TSVs extending partially through the SOI wafer such as illustrated in FIG. 2 (e.g. TSVs 295), may be created using a one or two step process (e.g. silicon etch of wafer 103 and BOX 104 etch for a two step process). For a multilayer SOI structure with multiple stacked wafers, a multi-step via etch process with multiple silicon and oxide etches, repeated as needed to etch vias through the required layers, can be used for an embodiment with a multiple handling wafer SOI structure as illustrated and discussed with reference to FIG. 3.

TSVs 196 may be insulated by chemical vapor deposition (CVD) of nitride and/or sub-atomic CVD of oxide. TSVs 196 may be seeded by a physical vapor deposition (PVD) tool with tantalum or copper, for example, and filled with metal such as copper or tungsten in a TSV plating chamber. The wafer may be planarized using, for example, a standard chemical-mechanical polish (CMP) process. In some embodiments, TSVs 196 may not be insulated. TSVs 196 may be used to electrically connect contacts on semiconductor devices 190 and contacts on semiconductor devices 192 to the contacts of embedded semiconductor device 110. In an exemplary embodiment, TSVs 196 may electrically connect low voltage CMOS devices on a top surface and a bottom surface of wafer 100 in FIG. 1 such as semiconductor devices 190 and semiconductor devices 192 with an embedded HV MOS transistor such as semiconductor device 110.

In another embodiment, a combination of TSVs, for example, TSVs extending both partially through SOI wafer 200 similar to TSVs 295 in FIG. 2 and TSVs extending completely through a wafer such as TSVs 196 in FIG. 1 may be used in the same SOI wafer. For example, TSVs extending partially through a wafer, such as shown in FIG. 2, may connect top surface semiconductor devices (e.g. semiconductor devices 190) to an embedded semiconductor device (e.g. semiconductor device 110) in the same wafer as TSVs extending fully through wafer 100 in FIG. 1, like TSVs 196, connecting semiconductor devices on the top surface of wafer 100E (e.g. semiconductor devices 190) to semiconductor devices on the bottom side of wafer 100E (e.g. semiconductor devices 192) which may also connect embedded semiconductor devices (e.g. semiconductor device 110). Similarly, in an embodiment, TSVs extending through multiple wafers as illustrated and discussed with reference to FIG. 4 may be used with TSVs extending partially or completely through an SOI wafer. In some embodiments, a layer of tetraethyl orthosilicate (TEOS) is deposited on the wafer surfaces upon completion of TSV formation. The TEOS layer may be etched for electrical contact and polished.

Upon completion of TSVs 196, back end of the line (BEOL) wiring, wiring layers and BEOL devices such as inductors or metal insulator metal devices (MIMs) may be added to a top surface of wafer 103 and a bottom surface of handling wafer 105 (not shown in FIG. 1). BEOL line wiring and connections are formed with standard semiconductor processes.

FIG. 2 illustrates a cross-sectional view of a SOI wafer with a heat sink attached, according to an embodiment of the present invention. SOI wafer 200 is formed as discussed with respect to the formation of wafer 100E with reference to FIGS. 1A to 1E by bonding the oxide layer of handling wafer 105 with semiconductor devices 110 to the oxide layer of wafer 103 with semiconductor devices 190s, forming a SOI wafer with BOX 104. Semiconductor devices 190 may be low voltage CMOS semiconductor devices, another active semiconductor device or a combination of semiconductor devices (active semiconductor devices, or active semiconductor devices and passive semiconductor devices). In the exemplary embodiment, semiconductor devices 110 are HV MOS transistors, however, in other embodiments, semiconductor devices 110 may be another active semiconductor device such as a bipolar semiconductor device, a passive semiconductor device, a combination of active and passive devices or an array of semiconductor devices (i.e. an HV MOS transistor array). TSVs 295 extend partially through SOI wafer 200 electrically connecting contacts for semiconductor devices 190 to semiconductor devices 110 embedded in SOI wafer 200.

TSVs 297 may be created extending partially through SOI wafer 200 (as shown). In the exemplary embodiment, TSVs 297 have a larger diameter than TSVs 295 and may be thermal TSVs. TSVs 297 provide a direct thermal path from the backside of semiconductor devices 110 to heat sink 20 to remove heat generated by semiconductor device 110. Additionally, heat generated by the other semiconductor devices, such as semiconductor devices 190 in SOI wafer 200 may be removed by heat travelling through SOI wafer 200 to heat sink 20. The backside of SOI wafer 200 is bonded to heat sink 20 using conventional attachment processes, for example, a thermally conductive adhesive. With the use of larger diameter TSVs, such as TSVs 297, in contact with both of the backsides of the semiconductor devices 110 and in contact with an external heat sink, heat sink 20, the heat generated by semiconductor devices 110 may be removed, at least partially, from SOI wafer 200. Removing the heat generated by semiconductor devices 100 improves the operation of semiconductor devices 110 and the operation of any heat sensitive semiconductor devices such as semiconductor devices 190 on the top surface of wafer 200.

In another embodiment of the present invention, SOI wafer 200 may be diced into semiconductor chips and packaged such that a heat sink may be attached to the backside of the chip and TSVs 297 with a thermal adhesive.

FIG. 3 is an exemplary process flow chart 300 for creating the SOI wafer with a heat sink attached as illustrated in FIG. 2, according to an embodiment of the present invention. Starting with the wafer structure illustrated in FIG. 1D which was created using the processes discussed in FIGS. 1A-1D, the following processes are used to create the structure illustrated in FIG. 2.

Step 302, form the semiconductor devices on the top surface of the SOI wafer; wafer 100D in FIG. 1D. Semiconductor devices 190 are formed on the top surface of wafer 100D.

Step 304, etch the vias through the second wafer and BOX layer. Using a deep silicon etch process and an oxide etch process, vias are etched partially through the SOI wafer by etching vias through wafer 103 and BOX 104.

Step 306, insulate, seed and fill the vias to form TSVs. TSVs 295 are formed by the processes discussed in FIG. 1E (insulation by CVD, seed by PVD and fill by plating chamber) electrically connecting the contacts for semiconductor devices 190 to the contacts for semiconductor devices 110.

Step 308, thin the wafer backside. Handling wafer 105 is thinned by conventional thinning processes (backside wafer grind).

Step 310, etch the vias through the handling wafer. Vias are etched using a deep silicon etch process through handling wafer 105. Via diameter for vias through handling wafer 105 may be formed with a larger diameter than those through wafer 103 and BOX 104 allowing better heat dissipation from semiconductor devices 110 when filled and completed.

Step 312, insulate, seed and fill the vias to form TSVs. The processes used in step 306 are repeated to form TSVs 297. TSVs 297 contact the backside of semiconductor devices 110 and a bottom surface of the SOI wafer. BEOL wiring, layers and BEOL devices (not shown) can be created above semiconductor devices 190 as previously discussed.

Step 314, attach the heat sink to the SOI wafer. The heat sink 20 is attached by a thermally conductive adhesive to the backside of thinned handling wafer 105 in SOI wafer 200.

Figure 4:
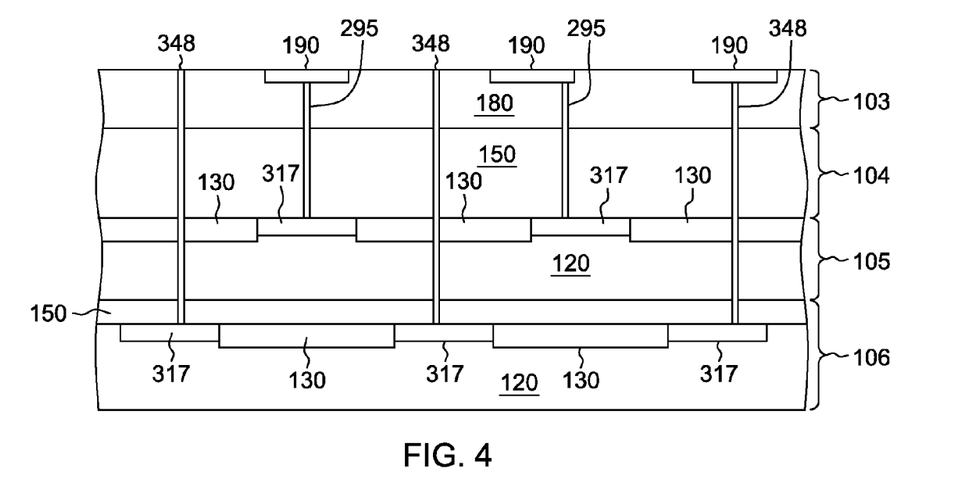
FIG. 4 illustrates a cross-sectional view of a stack of handling wafers with embedded well resistors bonded to form a SOI wafer, according to one embodiment of the present invention.

FIG. 4 illustrates a cross-sectional view of a stack of handling wafers with embedded well resistors bonded to form a SOI wafer, according to one embodiment of the present invention. The SOI wafer structure illustrated in FIG. 4 includes the semiconductor device elements previously formed and described in FIGS. 1A-1E and FIG. 2. Handling wafer 105 and handling wafer 106 may have passive devices 317 on the top surface. Devices 317, depicted as diffusion or well resistors, may be another type of passive semiconductor device such as waveguides, for example. In an embodiment, devices 317 may be a combination of passive and active semiconductor devices. Devices 317 are separated by STIs 130 on handling wafer 105 and handling wafer 106. For the purposes of illustration, two handling wafers are depicted in FIG. 4; however, multiple handling wafers may be stacked, bonded and connected by TSVs to each other and to top surface semiconductor devices 190.

In FIG. 4, wafer 103 may have top surface semiconductor devices 190 which may be low voltage CMOS devices or other active semiconductor devices. In other embodiments, semiconductor devices 190 may be passive semiconductor devices or a combination of active and passive semiconductor devices. Oxide 150 forms BOX 104 between wafer 103 and handling wafer 105. An oxide layer of oxide 150 is deposited on the top surface of handling wafer 106. Not shown in FIG. 4, are BEOL wiring, layers and BEOL devices which may be present. In some embodiments, semiconductor devices 190 may be a combination of active and passive semiconductor devices.

TSVs 295 electrically connect contacts for semiconductor devices 190 with contacts for devices 317 on handling wafer 105. Devices 317 may be passive semiconductor devices such as well resistors, waveguide or other passive devices. In one embodiment, devices 317 may be active semiconductor devices or a combination of passive and active semiconductor devices. TSVs 348 electrically connect contacts on semiconductor devices 190 to contacts for devices 317 on handling wafer 106. While FIG. 4 depicts two handling wafers (e.g. wafer 105 and wafer 106), the present invention is not limited to two handling wafers but, may have one or more additional handling wafers. In an embodiment of the present invention, the SOI wafer structure may be a stack of semiconductor wafers or more specifically, a stack of numerous bonded handling wafers and another top wafer such as wafer 103. In one embodiment, semiconductor devices may be formed on the bottom of the bottom handling wafer in the wafer stack, for example, semiconductor wafer 106. The semiconductor devices may be active semiconductor devices, passive semiconductor devices or a combination of active and passive semiconductor devices.

Figure 5:
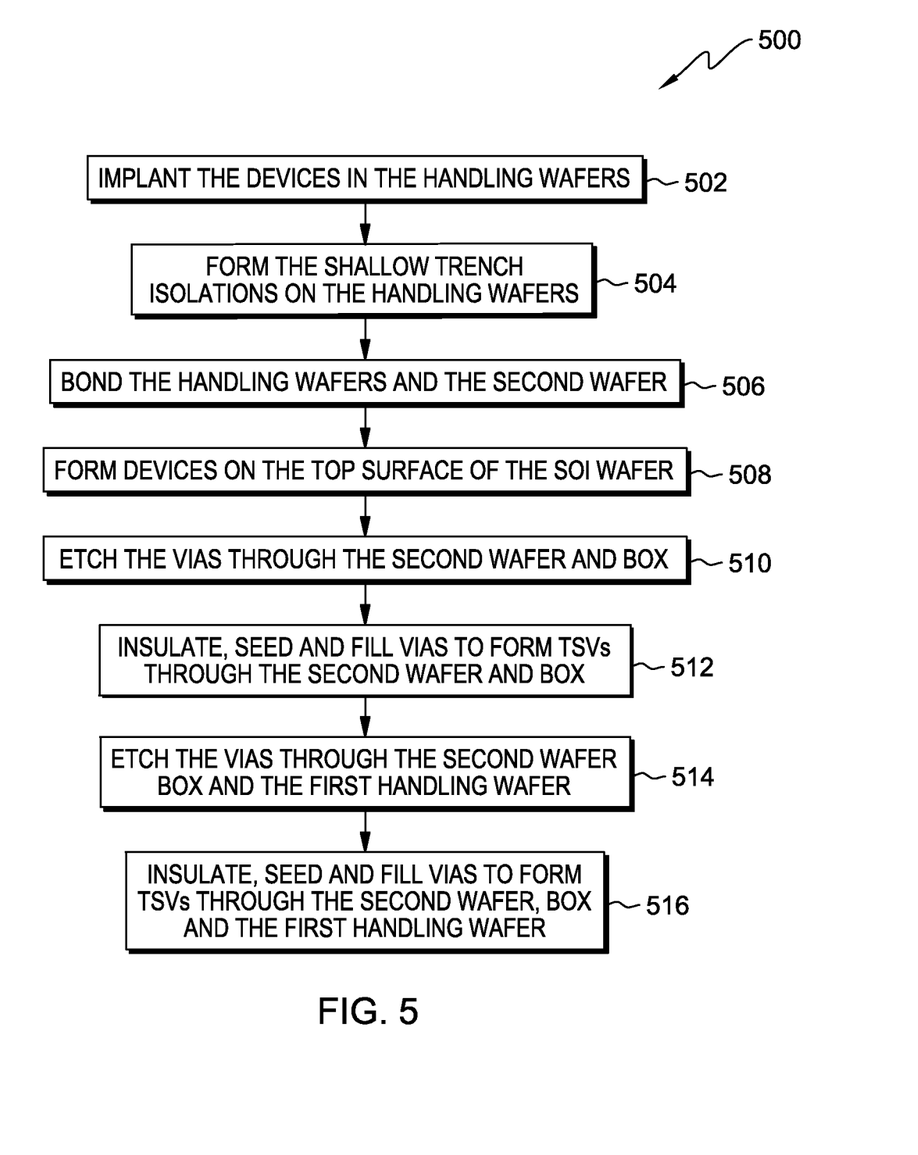
FIG. 5 is an exemplary process flow chart for creating the stack of handling wafers with embedded well resistors bonded to form the SOI wafer illustrated in FIG. 4, according to one embodiment of the present invention.

FIG. 5 is an exemplary process flow chart 500 for creating the stack of handling wafers with embedded well resistors bonded to form the SOI wafer as illustrated in FIG. 4, according to one embodiment of the present invention.

Step 502, implant semiconductor devices in the handling wafers. Using the processes discussed in FIG. 1A, passive semiconductor devices such as the well resistors (devices 317) depicted in FIG. 4 are formed through ion implants on the top surfaces of handling wafer 105 and handling wafer 106.

Step 504, form shallow trench isolations on the handling wafers. Using the standard semiconductor manufacturing processes discussed in FIG. 1B, STIs 130 may be formed and filled with oxide 150 as a layer of oxide 150 is deposited on the top surface of each wafer (e.g. on the top surface of wafer 105 and on the top surface of wafer 106). A planarization step such as CMP may be performed after oxide deposit on each handling wafer. Two STIs are shown on wafer 106, however multiple STIs 130 and similarly, multiple devices 317 may be created on the top surface of each handling wafer as determined by the designer based on semiconductor device application requirements, wafer available space and manufacturing processes.

Step 506, bond the handling wafers and the second wafer. Wafer 103 which may have active semiconductor devices 190 such as low voltage CMOS devices, is covered with an oxide layer such as oxide 150 on the bottom of wafer 103. The oxide layer on the bottom of wafer 103 may be bonded to the oxide layer composed of oxide 150 on the top surface of handling wafer 105 using previously discussed methods. Similarly, the oxide layers, which may be planarized, on the top surface of handling wafer 106 may be bonded to an oxide layer on the bottom surface of handling wafer 105 using a fusion bonding method or an adhesive bonding method to form a SOI wafer structure. In another embodiment, the oxide on the top surface of wafer 106 may be bonded to the semiconductor material or silicon on the bottom surface of wafer 105. In another embodiment, the two handling wafers may be bonded together before bonding to wafer 103. In yet another embodiment, the bonding of wafer 103, wafer 105 and wafer 106 may be done simultaneously in a single bonding step.

Step 508, form semiconductor devices on the top surface of the SOI wafer. Using conventional manufacturing processes as discussed in FIG. 1D, semiconductor devices 190 are formed on the top of wafer 103.

Step 510, etch the vias through the second wafer and BOX 104. Using the processes discussed in FIG. 1E and FIG. 3, TSVs 295 are formed through wafer 103 and BOX 104. TSVs 295 extend partially through the SOI wafer to connect contacts for semiconductor devices 190 to contacts for devices 317.

Step 512, insulate, seed and fill vias to form TSVs through the second wafer and BOX. Using the previously discussed processes in FIG. 1E, vias are etched through wafer 103, BOX 104 and handling wafer 105 using a multi-step process. For a multilayer SOI structure with multiple stacked wafers, a multi-step via etch process with multiple silicon and oxide etches, repeated as needed to etch vias through the required layers, can be used for an embodiment with a multiple handling wafer SOI structure as illustrated in FIG. 4.

Step 514, etch the vias through the second wafer, BOX, and the first handling wafer. In an embodiment, the vias are additionally etched through the oxide layer on the second handling wafer. Using the processes previously discussed in FIG. 1E, vias can be etched through wafer 103, BOX 104, wafer 105 and oxide 150.

Step 516, insulate, seed, and fill vias to form TSVs through the second wafer, BOX and the first handling wafer. Using the processes previously discussed in FIG. 1E, TSVs 348 may be formed as the vias are insulated, seeded and filled with metal creating electrical connections between semiconductor devices 190 and devices 317 on handling wafer 106.

TSVs 348 extend further through the SOI wafer than TSVs 295, passing through wafer 103, BOX 104, handling wafer 105 and the oxide layer (composed of oxide 150) below handling wafer 105 to semiconductor device contacts on the top surface of handling wafer 106 thus, connecting devices 317 embedded in handling wafer 106 to top surface active semiconductor devices (e.g. semiconductor devices 190) and other passive or active semiconductor devices embedded in handling wafer 105. Upon completion of TSVs, the back end of line (BEOL) processing of metal lines and any wiring layers, connections between semiconductor devices, TSVs and BEOL devices such as inductors may completed (not shown in FIG. 4).

The processes and structure discussed in FIGS. 4 and 5 are not intended to be limited to two handling wafers but, may used to create an embodiment of the present invention with a multiple layer handling wafer stack using three or more handling wafers stacked and bonded to wafer 103 forming an SOI wafer with multiple handling wafers with embedded passive devices.

In some embodiments, the SOI wafers formed by the embodiments of the present invention may be diced in semiconductor chip form. The resulting semiconductor chips can be distributed by the fabricator in raw wafer form (that is, as a single wafer that has multiple unpackaged chips), as a bare die or in a packaged form. In the latter case, the chip is mounted in a single chip package (such as a plastic carrier, with lead that is affixed to a motherboard or other higher level carrier) or in a multichip package (such as a ceramic carrier that has either or both surface interconnections or buried interconnections). In any case the chip is then integrated with other chips, discreet circuit elements, motherboard or (b) end product. The end product can be any product that includes integrated circuit chips, ranging from toys and other low-end applications to advanced computer products having a display, a keyboard or other input device and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
providing a first semiconductor wafer having a first top surface and a first bottom surface opposite the first top surface;
creating one or more semiconductor device elements on the first top surface of the first semiconductor wafer so as to form a first semiconductor device on the first top surface of the first semiconductor wafer;
forming a first dielectric material layer on the first top surface of the first semiconductor wafer over the first semiconductor device;
providing a second semiconductor wafer having a second top surface and a second bottom surface opposite the second top surface;
forming a second dielectric material layer immediately adjacent to the second bottom surface of the second semiconductor wafer;
bonding the second dielectric material layer on the second bottom surface of the second semiconductor wafer directly to the first dielectric material layer on the first top surface of the first semiconductor wafer;
after the bonding, forming at least one second semiconductor device on the second top surface of the second semiconductor wafer; and
creating a through silicon via, the through silicon via extending vertically through the second semiconductor wafer, the second dielectric material layer and the first dielectric material layer to the first semiconductor device and electrically connecting the second semiconductor device on the second top surface of the second semiconductor wafer to the first semiconductor device on the first top surface of the first semiconductor wafer.

2. The method of claim 1, further comprising:
before the forming of the first dielectric material layer, forming one or more shallow isolation trenches and at least one additional semiconductor device element on the first top surface of the first semiconductor wafer.

3. The method of claim 1, the first semiconductor device formed on the first top surface of the first semiconductor wafer comprising any one of: a high voltage metal oxide transistor, a laterally diffused metal oxide semiconductor device, an active semiconductor device requiring significant semiconductor wafer area, an active semiconductor device requiring high voltage, an array of active semiconductor devices, a passive semiconductor device and a combination of active semiconductor devices and passive semiconductor devices.

4. The method of claim 1, further comprising, after the bonding, forming an additional first semiconductor device on the first bottom surface of the first semiconductor wafer, the additional first semiconductor device comprising a doped region within the first semiconductor wafer at the first bottom surface and being any of: an active semiconductor device and a passive semiconductor device.

5. The method of claim 4, further comprising creating an additional through silicon via connecting a second semiconductor device on the second top surface of the second semiconductor wafer to the additional first semiconductor device on the first bottom surface of the first semiconductor wafer.

6. The method of claim 4, further comprising creating an additional through silicon via connecting the first semiconductor device on the first top surface of the first semiconductor wafer to the additional first semiconductor device on the first bottom surface of the first semiconductor wafer.

7. The method of claim 1, further comprising thinning the first semiconductor wafer by grinding the first bottom surface.

8. The method of claim 7, further comprising:
after the thinning, creating additional through silicon vias extending vertically from the first bottom surface of the first semiconductor wafer to and in contact with the first semiconductor device; and
after the creating of the additional through silicon vias, attaching a heat sink to the first bottom surface of the first semiconductor wafer, the heat sink being immediately adjacent to the additional through silicon vias.

9. The method of claim 8, the additional through silicon vias having a diameter larger than a diameter of the through silicon via connecting the second semiconductor device to the first semiconductor wafer.

10. A method comprising:
providing a first semiconductor wafer having a first top surface and a first bottom surface opposite the first top surface;
creating one or more semiconductor device elements on the first top surface of the first semiconductor wafer so as to form a first semiconductor device on the first top surface of the first semiconductor wafer;
forming a first dielectric material layer on the first top surface of the first semiconductor wafer over the first semiconductor device, the first bottom surface of the first semiconductor wafer being bonded directly to an additional dielectric material layer over an additional semiconductor device on an additional semiconductor wafer prior to formation of the first semiconductor device and the first dielectric material layer;
providing a second semiconductor wafer having a second top surface and a second bottom surface opposite the second top surface;
forming a second dielectric material layer immediately adjacent to the second bottom surface of the second semiconductor wafer;
bonding the second dielectric material layer on the second bottom surface of the second semiconductor wafer directly to the first dielectric material layer on the first top surface of the first semiconductor wafer;
after the bonding, forming second semiconductor devices on the second top surface of the second semiconductor wafer; and
creating a first through silicon via and a second through silicon via, the first through silicon via extending vertically through the second semiconductor wafer, the second dielectric material layer and the first dielectric material layer to the first semiconductor device and electrically connecting a first one of the second semiconductor devices to the first semiconductor device and the second through silicon via extending vertically through the second semiconductor wafer, the second dielectric material layer, the first dielectric material layer, the first semiconductor wafer and the additional dielectric material layer to the additional semiconductor device and electrically connecting a second one of the second semiconductor devices to the additional semiconductor device.

11. The method of claim 10, the first semiconductor device and the additional semiconductor device comprising passive semiconductor devices.

12. The method of claim 10, the first semiconductor device and the additional semiconductor device comprising any of at least one active semiconductor device and a combination of at least one active semiconductor device and at least one passive semiconductor device.

13. A structure comprising:
a first semiconductor wafer having a first bottom surface and a first top surface opposite the first bottom surface, the first semiconductor wafer comprising a first semiconductor device on the first top surface of the first semiconductor wafer;
a first dielectric material layer on the first top surface covering the first semiconductor device;
a second semiconductor wafer having a second top surface and a second bottom surface opposite the second top surface, the second semiconductor wafer comprising a second semiconductor device on the second top surface of the second semiconductor wafer;
a second dielectric material layer immediately adjacent to the second bottom surface of the second semiconductor wafer, the second dielectric material layer being bonded to the first dielectric material layer;
a through silicon via that extends vertically through the second semiconductor wafer, the second dielectric material layer and the first dielectric material layer to the first semiconductor device and electrically connects the second semiconductor device to the first semiconductor device; and,
additional through silicon vias extending vertically from the first bottom surface of the first semiconductor wafer to the first semiconductor device, the additional through silicon vias having a diameter that is larger than a diameter of the through silicon via.

14. The structure of claim 13, the first semiconductor device comprising a gate embedded in the first dielectric material layer.

15. The structure of claim 13, the first semiconductor device comprising any of: a high voltage metal oxide transistor, a laterally diffused metal oxide semiconductor device and a combination of at least one active semiconductor device and at least one passive semiconductor device.

16. The structure of claim 13, the first semiconductor device comprising high voltage metal oxide semiconductor device.

17. The structure of claim 16, the second semiconductor device comprising a low voltage metal oxide semiconductor device.

18. The structure of claim 13, further comprising a heat sink attached to the first bottom surface of the first semiconductor wafer immediately adjacent to the additional through silicon vias.

19. The structure of claim 13, the second semiconductor device comprising any of an active semiconductor device and a passive semiconductor device.

* * * * *